United States Patent [19]
Lindner et al.

[11] 4,103,259
[45] Jul. 25, 1978

[54] SEMICONDUCTOR OSCILLATOR FOR VERY SHORT WAVES

[75] Inventors: Kurt Lindner, Ulm, Donau; Werner Wiesbeck, Neu-Ulm, both of Germany

[73] Assignee: Licentia Patent-Verwaltungs-GmbH, Frankfurt am Main, Germany

[21] Appl. No.: 782,090

[22] Filed: Mar. 28, 1977

[30] Foreign Application Priority Data

Mar. 27, 1976 [DE] Fed. Rep. of Germany ....... 2613119

[51] Int. Cl.² .............................................. H03B 5/18
[52] U.S. Cl. .................................. 331/117 D; 331/99; 333/84 M
[58] Field of Search ...................... 331/117 D, 117, 96, 331/99; 333/84 M, 38 M, 57

[56] References Cited

U.S. PATENT DOCUMENTS

| 3,868,594 | 2/1975 | Cornwell et al. | 331/99 |
| 3,952,262 | 4/1976 | Jamison | 330/57 |
| 3,965,445 | 6/1976 | Ou | 333/84 |
| 4,010,428 | 3/1977 | Sunkler | 331/117 D |

OTHER PUBLICATIONS

Source Book of Electrone Circuits, Markus pp. 462–463, 1968.

Primary Examiner—John Kominski
Attorney, Agent, or Firm—Spencer & Kaye

[57] ABSTRACT

A semiconductor oscillator circuit for very short waves, particularly for UHF, employing the stripline technique and utilizing capacitive voltage division in order to provide feedback. The stripline technique is employed at least, for all the discrete frequency determining (capacitive and inductive) components of the circuit and for the feedback path of the circuit. The series connection of the two capacitors forming the capacitive voltage divider is connected in parallel with a further capacitor, formed in stripline technique, whose capacitance lies in the same order of magnitude as that of one of the capacitors of the capacitive voltage divider and the two capacitors which have the same order of magnitude in capacitance are formed by two conductor electrodes which are parallel to each other at a very small mutual distance with respect to their geometric dimensions, which have a length and width corresponding to their capacitance, and which have a common return electrode.

15 Claims, 6 Drawing Figures

SEMICONDUCTOR OSCILLATOR FOR VERY SHORT WAVES

BACKGROUND OF THE INVENTION

The present invention relates to a semiconductor oscillator circuit for very short waves, which circuit includes capacitive voltage division to provide feedback and can be used with particular advantage as a control voltage generator for a single or multiple stage UHF transmitter and as a superheterodyne oscillator in a UHF receiver. More particularly, the present invention provides a design for such an oscillator circuit so as to impart to same an extremely high resistance to mechanical shocks and high operational dependability even at great accelerations as they are frequently encountered, for example, by the oscillators of the electronic detonator systems for projectiles and rockets as well as in the telemetry and radar art. The active component or device of such a semiconductor oscillator circuit is predominantly a transistor or a transistor chip or comparable component of the integrated circuit art.

The known semiconductor oscillators for high mechanical stresses are produced to meet the requirements of various techniques for example, in the coaxial stripline or conventional techniques employing resonant circuits and feedback paths, they are formed of discrete components, i.e., paper capacitors or ceramic capacitors, single or multilayer coils and conductors. When used, for example, in projectile detonators, these known oscillator circuits often produce extensive frequency shifts or even fail completely, particularly during the acceleration phase. Moreover, according to the state of the art the expenditures required for realization are comparatively high due to the large number of components involved, and that must be considered a drawback.

SUMMARY OF THE INVENTION

It is the object of the present invention to provide a semiconductor oscillator which can be used in the UHF range and which has an operational dependability and frequency constancy which can essentially not be influenced by extremely high accelerations and the stresses of mechanical shocks.

The present invention solves this problem in that it utilizes the significant realization that the number of individual components of such an oscillator circuit must be reduced to a minimum and the feedback path and the resonant circuits must be made as stripline circuits. Accordingly, in the semiconductor oscillator according to the invention with capacitive voltage division to provide feedback, the stripline technique is employed for all the discrete frequency determining (capacitive and inductive) components of the circuit and for the feedback path of the circuit. The feedback path is realized in that the series connection of the two capacitors forming the capacitive voltage divider is connected in parallel with a further capacitor formed in the stripline technique which has a capacitance equal in its order of magnitude to that of one capacitor of the capacitive voltage divider and the two capacitors which have the same order of magnitude of capacitance are formed by two parallel conductor electrodes which are associated with a common spaced return electrode, which are of a length and width which corresponds to their capacitance, and which are parallel to one another at a small mutual spacing with respect to their geometric dimensions.

The term "discrete components" as used in this application is understood to mean all inductances and capacitances of the oscillator circuit inasmuch as they are frequency determining but not the inductances or capacitances inherent in the semiconductor or solid state active component of the oscillator circuit.

When the active oscillator semiconductor device is provided in the hybrid technique the connection leads from the active device to the striplines must be kept as short as possible.

Compared to conventional oscillator circuits with coils and capacitors, the semiconductor oscillator circuit according to the invention exhibits extremely low mass inertia during acceleration, and frequency shifts as a result of a mechanical deformation occur practically not at all. By the elimination of discrete devices, and thus the required solder connections, the operational dependability of the oscillator circuit according to the invention is additionally improved compared to the state of the art. Since only stripline elements are used in the resonant circuit and in the feedback path of the oscillator circuit according to the invention, the electrical characteristics can very excellently be reproduced. Moreover, fabrication in large quantities poses no problems. Additionally, it is possible to tune the oscillator circuit in an automatic tuning process e.g. by means of a laser or by sandblasting, in a range of about $\pm 10\%$ in order to compensate for statistical fabrication tolerances or, in military use, in order to make enemy interference more difficult by employing different oscillator frequencies.

DETAILED DESCRIPTION OF THE PREFERRED EMBODIMENTS

Figure 1:
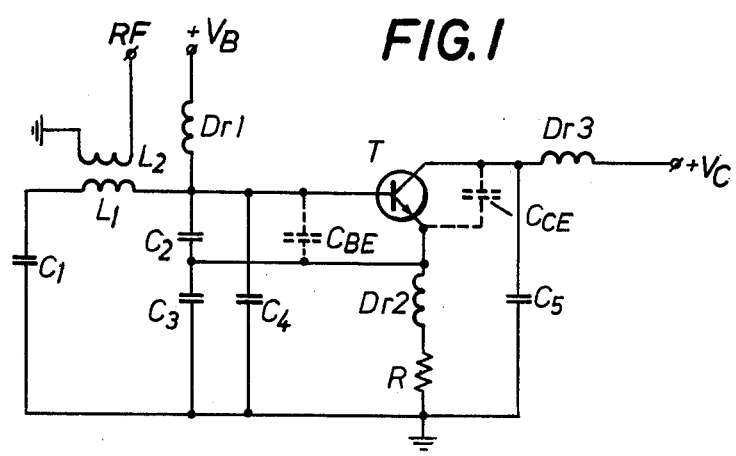
FIG. 1 is an electrical equivalent circuit diagram for a preferred embodiment of a transistor oscillator circuit according to the invention which is designed in the manner of a Clapp oscillator.

Referring now to FIG. 1 there is shown the circuit diagram for a Clapp oscillator which is a special version of a Colpitts oscillator and which is known to include the features that the frequency determining resonant circuit of the oscillator circuit is a series resonant circuit and that the feedback voltage is coupled in via a capacitive voltage divider. A particular advantage of this technique is the low frequency dependency of this type of oscillator circuit on fluctuations of the internal capacitances of the capacitive oscillator device.

As shown in FIG. 1, the oscillator circuit includes a series resonant circuit whose inductance is indicated by the coil $L_1$ which is connected in series with a capacitor $C_1$. The series connection of the coil $L_1$ and the capacitor $C_1$ is connected in parallel with a capacitive voltage divider $C_2$-$C_3$ and with a further capacitor $C_4$. The active semiconductor device of the oscillator circuit is a transistor T having its base connected to the common junction of the coil $L_1$, the capacitor $C_2$ and the capacitor $C_4$, its collector connected to ground (and the common junction of capacitors $C_1$, $C_3$ and $C_4$) via a capacitor $C_5$, and its emitter connected to ground via a high frequency choke D$r$2 and a resistor $R_1$ and to the input of the capacitive voltage divider $C_2$-$C_3$ to provide a feedback voltage.

Figure 2:
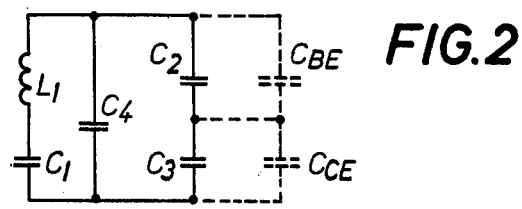
FIG. 2 is a schematic circuit diagram of the capacitances and inductances which are present in the oscillator circuit of FIG. 1.

In addition to the above described discrete frequency and feedback determining inductance and capacitances, the circuit of FIG. 1 also includes (see also FIG. 2) the internal capacitances of the transistor T, i.e., the base-emitter capacitance $C_{BE}$ and the collector/emitter capacitance $C_{CE}$. The capacitance of the capacitor $C_5$ which provides high frequency grounding of the collector of transistor T can remain unconsidered when determining the frequeny of oscillation of the circuit of FIG. 1 since the capacitor $C_5$ acts like a short circuit with respect to high frequencies. However, the equivalent capacitance of the series connection of the high frequency choke D$r$2 and the ohmic resistor R in the emitter lead of transistor T must be included in the calculation of the capacitance $C_{CE}$.

In order to operate the oscillator circuit of FIG. 1, bias potentials $V_B$ and $V_C$ are supplied to the base and collector leads of the transistor T via high frequency chokes D$r$1 and D$r$3 respectively which provide for high frequency separation. Finally, transformer decoupling of the oscillator output voltage HF is provided by means of a coil $L_2$ which is inductively coupled with the inductance of coil $L_1$.

Figure 3:
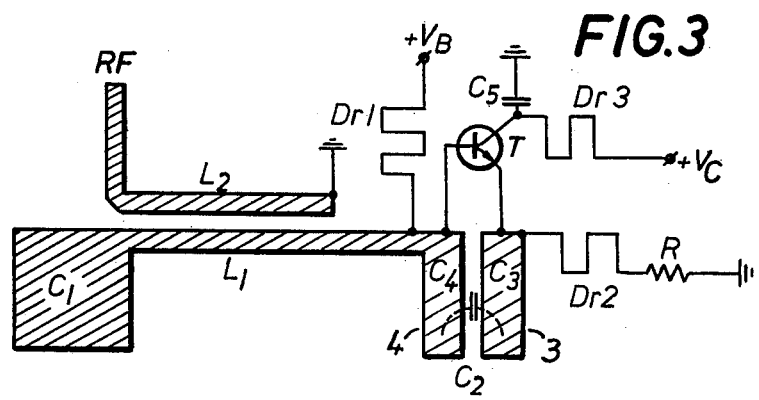
FIG. 3 is a schematic plan view of the circuit of FIG. 1 constructed in stripline technique according to the invention.

Turning now to FIG. 3 there is shown the manner of realization of the circuit of FIG. 1 according to the present invention in that all of the transistor-external capacitances and inductances insofar as they are frequency determining are produced in the stripline technique (microstrips). Preferably a common ceramic substrate is employed, i.e., the ceramic stripline technique is used.

Figure 4:
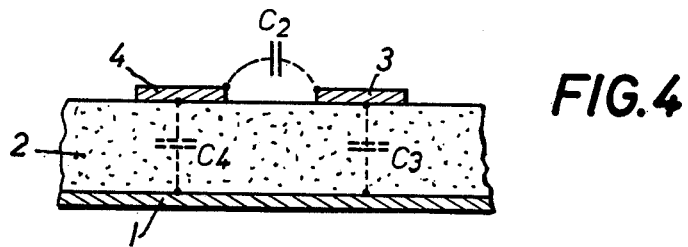
FIG. 4 is a partial cross-sectional view of the circuit of FIG. 3 illustrating the manner in which the capacitors $C_2$-$C_4$ are realized.

In the practical embodiment of the invention shown in FIG. 3 the capacitance of capacitor $C_3$ is selected to be approximately equal to that of capacitor $C_4$. These two capacitors $C_3$ and $C_4$ are formed by two rectangular conductor electrodes 3 and 4 which, as more clearly shown in FIG. 4, are arranged parallel to one another, and at a small mutual distance with reference to their geometric dimensions, on one surface of a ceramic substrate 2 above a common counter or return electrode 1 formed on the opposite surface of the substrate 2. The length and width of the two conductor electrodes is selected to correspond to the associated desired capacitances, which in the illustrated example are approximately equal.

The mutual spacing of conductor electrodes 3 and 4, which in conjunction with their common counterelectrode 1 form capacitors $C_3$ or $C_4$, respectively, is advantageously selected according to the desired capacitance of the other one of the two capacitors forming the capacitive voltage divider, i.e., the capacitor $C_2$. This capacitor $C_2$ is thus additionally realized by the conductor electrodes 3 and 4.

As shown in FIG. 3, the base of transistor T is connected with one narrow side of one of the two conductor electrodes 3 and 4 (electrode 4 in the illustrated embodiment), while the emitter of transistor T is galvanically connected to the one narrow side of the other of the two conductor electrodes 3 and 4 (electrode 3 in the illustrated embodiment). Care must be taken in this connection that the connecting lines between the transistor T and the conductor electrodes 3 and 4 are kept as short as possible.

High frequency chokes D$r$1 and D$r$2 and/or ohmic resistors are connected to the conductor electrodes 3 and 4 at or near the points of connection thereto of the emitter and base leads, respectively, of transistor T to provide the transistor bias. In the preferred embodiment the high frequency chokes D$r$1 and D$r$2 are in the form of meander shaped $\lambda/4$ lines (where $\lambda$ is the operating wavelength) which are printed on the substrate 2 bias. The collector of the transistor T in the arrangement of FIG. 3 (as in the circuit of FIG. 1) is at ground potential with respect to high frequencies due to the capacitor $C_5$ which may be formed according to the stripline technique. However, if it should become necessary to use a capacitor for the capacitor $C_5$ which, due to its geometrically required dimensions, cannot be realized in the stripline technique, a hybrid capacitor, e.g. a ceramic capacitor, can be soldered into the circuit as the capacitor $C_5$ at this point. The high frequency choke D$r$3 connected to the collector of transistor T is formed according to the same concept as the other chokes D$r$1 and D$r$2, i.e., as a printed $\lambda'/4$ line.

The inductance or coil $L_1$ of the oscillator resonant circuit in the arrangement of FIG. 3 is realized by a linear conductor electrode which is formed on the surface of the substrate and is connected between its series capacitor $C_1$ and conductor electrode 4. The capacitor $C_1$ is formed according to the stripline technique; i.e. in the same manner as capacitor $C_3$ or $C_4$.

To couple out the oscillator high frequency voltage, a further conductor electrode corresponding to coil $L_2$ of FIG. 1 is arranged adjacent and parallel with the conductor electrode forming inductance $L_1$ and is grounded at one end.

In summary it can thus be noted that the arrangement of FIG. 3 is distinguished by the fact that all discrete frequency and feedback determining components as well as all HF chokes are designed as line structures in the stripline technique, with the stripline configuration of capacitors $C_3$ and $C_4$ being selected so that a feedback network results which consists of capacitors $C_2$, $C_3$ and $C_4$ and which has the advantage of requiring a very small number of components.

All of the capacitance values of the capacitors realized in stripline technique in the arrangement of FIG. 3 can be influenced by changing the width or the spacing, respectively, of the conductors forming the capacitors so that a once calculated arrangement which has been optimized in practice can be reproduced as often as desired. In practical experiments the advantage was noted that the feedback was surprisingly broadbanded in the range between 1 and 3 GHz.

In connection with mass production of the oscillator circuit arrangement according to the invention, it must be emphasized that it is easy to provide frequency matching by means of a laser arrangement in that the value of capacitor of $C_1$ is decreased or the value of inductance $L_1$ is increased. The oscillator according to the invention can be produced in thick films or thin films.

Figure 5:
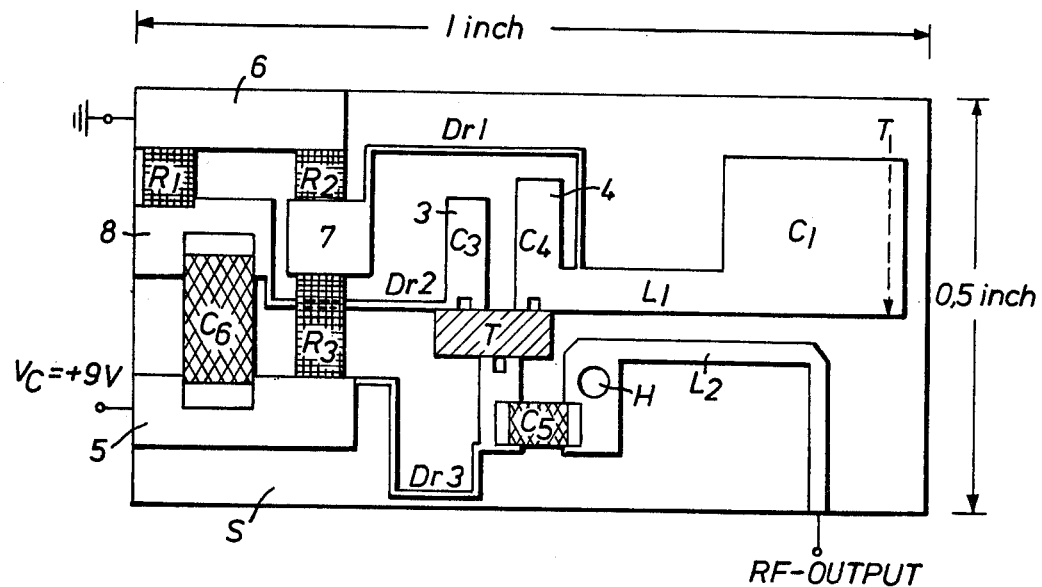
FIG. 5 is a top-view of an embodiment of the invention.

Referring to FIG. 5 there is shown a preferred embodiment of the invention. As far as the elements of the circuit according to FIG. 5 are identical to those elements described in connection with FIG. 3 identical designations are used in FIGS. 3 and 5. The circuit in FIG. 5 comprises additional elements which are now described:

Two resistors $R_2$ and $R_3$ are provided in order to produce the bias voltage for the transistor T. These resistors, which forms a voltage divider, are connected to the voltage source $V_C$ via conductors 5 and 6; a further conductor 7 connects the resistors $R_2$ and $R_3$ with each other. A conductor 8 connects the resistor $R_1$ with the HF-choke $Dr2$. A capacitor $C_6$ is included between the conductors 8 and 5 for DC-filtering. A hole H is provided within the substrate 2. The inner surface of this hole H is metallized for galvanic connection of the inductance $L_2$ and the capacitance $C_3$ with the return conductor on the reverse side of the substrate.

The broken line T in FIG. 5 symbolizes the possibility of laser trimming of the capacitance $C_1$; all other elements of the circuit according to FIG. 5 are likewise adjustable by laser technique. The substrate of the circuit according to FIG. 5 consists of ceramic, preferrably. The reverse side of the substrate is completely metallized over its entire surface. All geometrical dimensions of the elements of the circuit shown in FIG. 5 may be derived from the dimensions of the substrate; the thickness of the substrate may be 0.026', the remaining dimensions of the substrate are mentioned in the drawing.

The electrical values of the elements of an improved circuit according to FIG. 5 are the following:

$R_1$ = 56 Ohm
$R_2$ = 120 Ohm
$R_3$ = 820 Ohm

The transistor T may be Siemens-type BFR 35 or equivalent. The oscillator frequency of this circuit may be 2.5 GHz and the output power is typically 30 mW.

Figure 6:
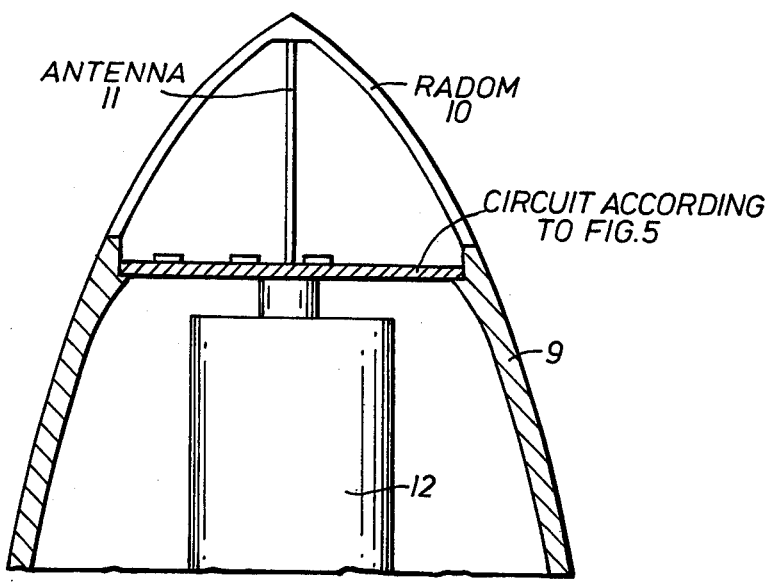
FIG. 6 is a partial cross-sectional view of a projectile detonator, e.g. a proximity fuse, incorporating a circuit according to FIG. 5.

Referring now to FIG. 6 there is shown a cross-sectional view of the top of a projectile detonator including a circuit according to FIG. 5. The circuit may be part of a proximity fuse of the detonator, but it is also usable as an oscillator of a telemetry arrangement of a mobile body. The reference numeral 9 indicates detonator, the top of which is realized by a radom 10, which houses an antenna 11. The box 12 within the wall 9 is the housing for the remaining parts of the circuit of the radar device for telemetry arrangement.

A clapp oscillator is e.g. mentioned on page 98 of the Dictonary of Electronics "RADIO SHACK" (1974/75) by Tandy-Corporation Company, Fort Worth, Tex., 76 107.

It will be understood that the above description of the present invention is susceptible to various modifications, changes and adaptations, and the same are intended to be comprehended within the meaning and range of equivalents of the appended claims.

What is claimed is:

1. In a semiconductor Clapp oscillator circuit for very short waves, particularly for UHF, including a series resonant circuit connected to an active semiconductor device and to a capacitive voltage divider, including first and second series connected capacitors, whose output is connected to said active semiconductor device for providing the feedback signal for the oscillator circuit; the improvement wherein: at least all of the discrete frequency determining capacitive and inductive components of said oscillator circuit are formed according to the stripline technique; a third capacitor whose capacitance is of the same order of magnitude as said first capacitance is connected in parallel with said capacitive voltage divider; and said first, second and third capacitors are formed according to the stripline technique, said first and third capacitors being formed by first and second conductor electrodes respectively which are arranged parallel to one another at a mutual spacing which is very small with respect to their geometrical dimensions and which are associated with a spaced common return electrode, said first and second conductor electrodes having a length and width corresponding to their associated capacitances, and said mutual spacing of said first and second parallel conductor electrodes is selected according to the desired capacitance of said second capacitor so that said second capacitor is formed by said first and second parallel conductor electrodes.

2. An oscillator circuit as defined in claim 1 wherein the stripline technique is used exclusively for the entire oscillator circuit.

3. An oscillator circuit as defined in claim 1 wherein said stripline technique employs a ceramic substrate with said conductor electrodes being on the surface of same.

4. An oscillator circuit as defined in claim 1 wherein said series resonant circuit includes an inductance and a fourth capacitor connected in series.

5. An oscillator circuit as defined in claim 4 wherein the inductance of said series resonant circuit is formed by a linear conductor electrode which is connected between said fourth capacitor and one of said first and second conductor electrodes.

6. An oscillator circuit as defined in claim 4 wherein, said active semiconductor device is a transistor; wherein means are provided for connecting the collector of said transistor to ground with respect to high frequency signals; and wherein means are provided for inductively coupling out the oscillator circuit output voltage in a transformer wise manner from the inductance of said series resonant circuit.

7. An oscillator circuit as defined in claim 1 wherein said active semiconductor device is a transistor having a base, a collector and an emitter; and wherein said base of said transistor is galvanically connected to one narrow edge surface of one of said first and second conductor electrodes and said emitter of said transistor is galvanically connected to one narrow edge surface of the other of said first and second conductor electrodes.

8. An oscillator circuit as defined in claim 7 further comprising: first and second HF chokes in the form of printed $\lambda/4$ lines (where $\lambda$= operating wavelength) connected respectively to said first and second conductor electrodes at or near the associated point of connection of said base and said emitter and through which the bias potentials can be supplied to said transistor; means for connecting said collector of said transistor to a source of bias potential and to ground with respect to high frequencies.

9. An oscillator circuit as defined in claim 8 wherein said means for connecting said collector of said transistor to ground with respect to high frequencies is a hybrid capacitor.

10. An oscillator circuit as defined in claim 8 wherein: said emitter and said base of said transistor are connected to said first and second conductor electrodes respectively; said series resonant circuit includes an inductance and a fourth capacitor connected in series; said inductance of said resonant circuit is formed by a linear conductor electrode which is connected between said fourth capacitor and said second conductor electrode; and means, including a further linear conductor positioned adjacent said linear conductor electrode forming said inductance of said resonant circuit, for inductively coupling out the output voltage of said oscillator circuit from said inductance of said resonant circuit in a transformer wise manner.

11. An oscillator circuit as defined in claim 1 wherein at least the non active components of said oscillator circuit are produced in thin film technique.

12. An oscillator circuit as defined in claim 1 wherein said oscillator circuit is used in an arrangement which is subjected to heavy mechanical stresses.

13. An oscillator circuit as defined in claim 1 wherein at least the non active components of said oscillator circuit are produced in thin film technique.

14. An oscillator arrangement as defined in claim 12 wherein said oscillator circuit is a part of the on board telemetry arrangement of a mobile body.

15. An oscillator circuit as defined in claim 12 wherein said oscillator circuit is a part of the radar device of a projectile detonator.

* * * * *